United States Patent
Cui

(10) Patent No.: US 9,163,176 B2
(45) Date of Patent: Oct. 20, 2015

(54) PHOSPHOR MIXTURE, OPTOELECTRONIC COMPONENT COMPRISING A PHOSPHOR MIXTURE, AND STREET LAMP COMPRISING A PHOSPHOR MIXTURE

(75) Inventor: Hailing Cui, Regensburg (DE)

(73) Assignee: OSRAM Opto Semiconductor GmbH (DE)

( * ) Notice: Subject to any disclaimer, the term of this patent is extended or adjusted under 35 U.S.C. 154(b) by 0 days.

(21) Appl. No.: 14/343,901

(22) PCT Filed: Sep. 14, 2012

(86) PCT No.: PCT/EP2012/068154
§ 371 (c)(1),
(2), (4) Date: Apr. 3, 2014

(87) PCT Pub. No.: WO2013/037973
PCT Pub. Date: Mar. 21, 2013

(65) Prior Publication Data
US 2014/0246692 A1    Sep. 4, 2014

(30) Foreign Application Priority Data

Sep. 15, 2011  (DE) .......................... 10 2011 113 498

(51) Int. Cl.
*H01L 33/50* (2010.01)
*C09K 11/77* (2006.01)
(Continued)

(52) U.S. Cl.
CPC ......... *C09K 11/7792* (2013.01); *C09K 11/7734* (2013.01); *C09K 11/7774* (2013.01);
(Continued)

(58) Field of Classification Search
CPC ..... H01L 33/50; H01L 33/502; H01L 33/504; H01L 33/07; H01L 33/32; H01L 2924/01058; H01L 2924/01063; C09K 11/7728; C09K 11/7715; C09K 11/7721; C09K 11/7734; C09K 11/7792

USPC ................ 257/98, 100, 89, E33.061, E33.06; 252/301.4 F; 313/503, 486, 467, 487
See application file for complete search history.

(56) References Cited

U.S. PATENT DOCUMENTS 7,700,002 B2 *   4/2010 Schmidt et al. ......... 252/301.4 F
2004/0135504 A1*   7/2004 Tamaki et al. ................ 313/512
(Continued)

FOREIGN PATENT DOCUMENTS

CN         1522291          8/2004
DE   10 2006 008 300 A1    8/2007
(Continued)

OTHER PUBLICATIONS

C.C. Lin et al., "Improving Optical Properties of White LED Fabricated by a Blue LED Chip with Yellow/Red Phosphors," Journal of the Electrochemical Society, vol. 157, No. 9, Jul. 26, 2010, pp. H900-H903.
(Continued)

*Primary Examiner* — Michael Trinh
(74) *Attorney, Agent, or Firm* — DLA Piper LLP (US)

(57) ABSTRACT

A phosphor mixture includes a first phosphor and a second phosphor, wherein an emission spectrum of the first phosphor has a relative intensity maximum in a yellow spectral range and an emission spectrum of the second phosphor has a relative intensity maximum in a red spectral range, the first phosphor corresponds to the following chemical formula: $(Lu_x Y_{1-x})_3(Al_{1-y}Ga_y)_5O_{12}:Ce^{3+}$, where x is greater than or equal to 0 and less than or equal to 1 and where y is greater than or equal to 0 and less than or equal to 0.4, and the phosphor mixture is formed from a plurality of particles, which includes a plurality of particles of the first phosphor and a plurality of particles of the second phosphor.

16 Claims, 3 Drawing Sheets

(51) Int. Cl.
*F21S 8/08* (2006.01)
*F21V 9/16* (2006.01)
*F21W 131/103* (2006.01)
*F21Y 101/02* (2006.01)

(52) U.S. Cl.
CPC  *F21S 8/088* (2013.01); *F21V 9/16* (2013.01); *H01L 33/50* (2013.01); *H01L 33/504* (2013.01); *F21W 2131/103* (2013.01); *F21Y 2101/02* (2013.01); *Y02B 20/72* (2013.01)

(56) References Cited

U.S. PATENT DOCUMENTS

| | | | |
|---|---|---|---|
| 2007/0024173 A1* | 2/2007 | Braune | 313/485 |
| 2008/0093614 A1 | 4/2008 | Nagai | |
| 2010/0142182 A1* | 6/2010 | Van Woudenberg et al. | 362/84 |
| 2011/0227477 A1* | 9/2011 | Zhang et al. | 313/503 |
| 2011/0279016 A1* | 11/2011 | Li et al. | 313/503 |
| 2012/0146078 A1 | 6/2012 | Baumann et al. | |

FOREIGN PATENT DOCUMENTS

| | | |
|---|---|---|
| WO | 2007/063460 A1 | 6/2007 |
| WO | 2007/122531 A2 | 11/2007 |
| WO | 2008/091319 | 7/2008 |
| WO | 2011/020751 | 2/2011 |
| WO | 2011/022392 A1 | 2/2011 |
| WO | 2011/022399 A1 | 2/2011 |

OTHER PUBLICATIONS

Zhou, Z., "Design of Solar Energy Led Street Lamp and its Application," *Publishing House of Electronics Industry*, Nov. 2009, pp. 154 (book) and 1 sheet of English translation.

G.Y. Hong, "Seltenerd-Leuchtstoffe-Grundlagen und Anwendungen," Science Press Apr. 2011, pp. 233-234 along with partial English translation.

* cited by examiner

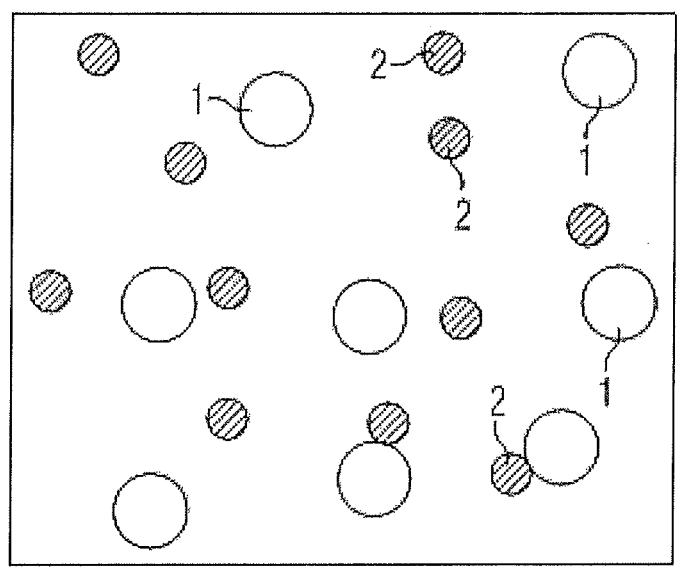
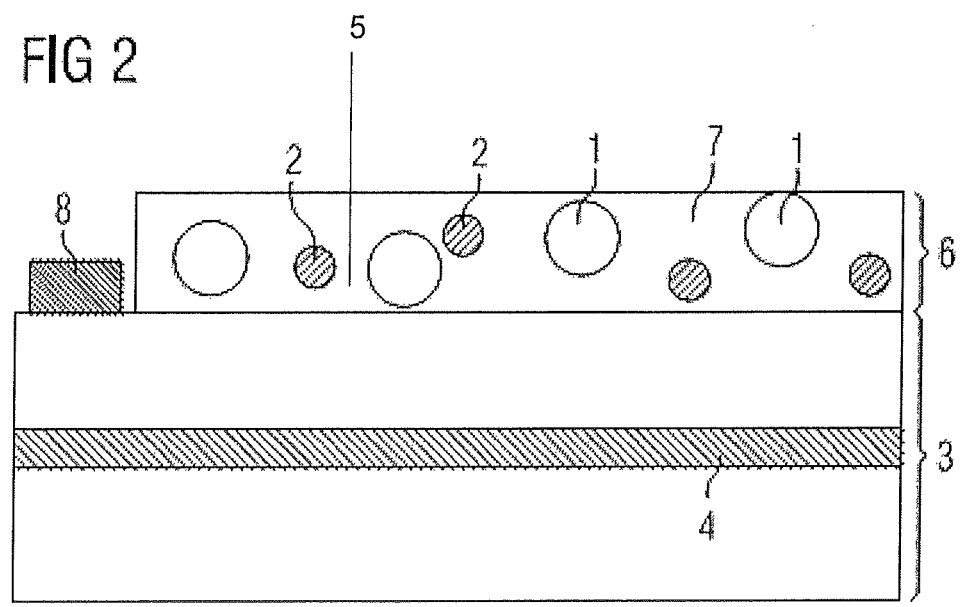

PHOSPHOR MIXTURE, OPTOELECTRONIC COMPONENT COMPRISING A PHOSPHOR MIXTURE, AND STREET LAMP COMPRISING A PHOSPHOR MIXTURE

TECHNICAL FIELD

This disclosure relates to a phosphor mixture, an optoelectronic component comprising a phosphor mixture, and a street lamp comprising a phosphor mixture.

BACKGROUND

There is a need for a phosphor mixture which has a long lifetime and is suitable for generating warm-white light with high efficiency. In particular, there is a need for a phosphor mixture suitable for use at high temperatures, as well as an optoelectronic component and a street lamp comprising such a phosphor mixture.

SUMMARY

I provide a phosphor mixture including a first phosphor and a second phosphor, wherein an emission spectrum of the first phosphor has a relative intensity maximum in a yellow spectral range and an emission spectrum of the second phosphor has a relative intensity maximum in a red spectral range, the first phosphor corresponds to the following chemical formula: $(Lu_xY_{1-x})_3(Al_{1-y}Ga_y)_5O_{12}:Ce^{3+}$, where x is greater than or equal to 0 and less than or equal to 1 and where y is greater than or equal to 0 and less than or equal to 0.4, and the phosphor mixture is formed from a plurality of particles, which includes a plurality of particles of the first phosphor and a plurality of particles of the second phosphor.

I also provide an optoelectronic component including a semiconductor body which emits electromagnetic radiation of a first wavelength range during operation, and the phosphor mixture including a first phosphor and a second phosphor, wherein an emission spectrum of the first phosphor has a relative intensity maximum in a yellow spectral range and an emission spectrum of the second phosphor has a relative intensity maximum in a red spectral range, the first phosphor corresponds to the following chemical formula: $(Lu_xY_{1-x})_3(Al_{1-y}Ga_y)_5O_{12}:Ce^{3+}$, where x is greater than or equal to 0 and less than or equal to 1 and where y is greater than or equal to 0 and less than or equal to 0.4, and the phosphor mixture is formed from a plurality of particles, which includes a plurality of particles of the first phosphor and a plurality of particles of the second phosphor, which converts at least part of radiation of a first wavelength range emitted by the semiconductor body into radiation of a second wavelength range different from the first wavelength range, and into radiation of a third wavelength range different from the first and second wavelength ranges.

I further provide a street lamp including a semiconductor body that emits electromagnetic radiation of a first wavelength range during operation, and the phosphor mixture including a first phosphor and a second phosphor, wherein an emission spectrum of the first phosphor has a relative intensity maximum in a yellow spectral range and an emission spectrum of the second phosphor has a relative intensity maximum in a red spectral range, the first phosphor corresponds to the following chemical formula: $(Lu_xY_{1-x})_3(Al_{1-y}Ga_y)_5O_{12}:Ce^{3+}$, where x is greater than or equal to 0 and less than or equal to 1 and where y is greater than or equal to 0 and less than or equal to 0.4, and the phosphor mixture is formed from a plurality of particles, which includes a plurality of particles of the first phosphor and a plurality of particles of the second phosphor which converts at least part of radiation of a first wavelength range emitted by the semiconductor body into radiation of a second wavelength range different from the first wavelength range, and into radiation of a third wavelength range different from the first and second wavelength ranges.

BRIEF DESCRIPTION OF THE DRAWINGS

FIG. 1 shows a schematic illustration of a phosphor mixture in accordance with an example.

FIG. 2 shows an optoelectronic component in accordance with a first example.

DETAILED DESCRIPTION

Figure 3:
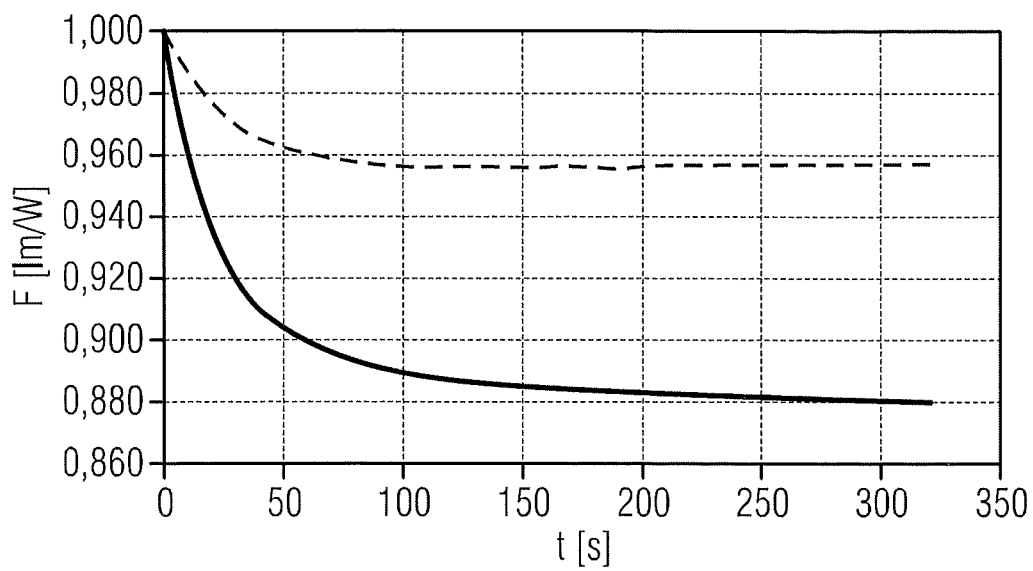
FIG. 3 shows measured values of the luminous flux F of an optoelectronic component in lumens per watt as a function of time t in seconds.

The phosphor mixture comprises a first phosphor and a second phosphor, wherein the emission spectrum of the first phosphor has a relative intensity maximum in the yellow spectral range and the emission spectrum of the second phosphor has a relative intensity maximum in the red spectral range.

In particular, the phosphor mixture generates light having a color locus in the warm-white range of the CIE standard chromaticity diagram upon excitation with light from the blue spectral range. For this purpose, the first phosphor preferably converts a portion of incident blue light of a first wavelength range into yellow light of a second wavelength range, while the second phosphor preferably converts a further portion of the incident blue light of the first wavelength range into red light of a third wavelength range. Particularly preferably, a portion of the incident blue light of the first wavelength range remains unconverted, thus giving rise to mixed light composed of blue unconverted light of the first wavelength range and yellow light of the second wavelength range converted by the first phosphor and red converted light of the third wavelength range.

Particularly preferably, the light generated by the phosphor mixture upon excitation with blue light has a color locus of 3000 K to 6500 K. The color rendering index Ra of the light generated by the phosphor mixture upon excitation with blue light is at least 70.

Particularly preferably, the phosphor mixture is stable relative to operating temperatures of greater than or equal to 85° C.

Preferably, the first phosphor is a garnet phosphor. The garnet phosphor is furthermore particularly preferably cerium-doped. The garnet phosphor thus preferably comprises cerium as dopant. The cerium content is preferably 0.3 mol % to 6 mol %.

Preferably, the first phosphor corresponds to the following chemical formula: $(Lu_xY_{1-x})_3(Al_{1-y}Ga_y)_5O_{12}:Ce^{3+}$, where x is greater than or equal to 0 and less than or equal to 1 and where y is greater than or equal to 0 and less than or equal to 0.4. In this case, the cerium content is in each case preferably 0.3 mol % to 6 mol % relative to the substance amount of lutetium and yttrium in moles.

Particularly preferably, the first phosphor is selected from the group consisting of $Y_3Al_5O_{12}:Ce^{3+}$, $(Lu,Y)_3Al_5O_{12}:Ce^{3+}$, $Y_3(Al,Ga)_5O_{12}:Ce^{3+}$ and $(Lu,Y)_3(Al,Ga)_5O_{12}:Ce^{3+}$. In this case, the cerium content is likewise in each case preferably 0.3 mol % to 6 mol % relative to the substance amount of lutetium and yttrium in moles.

Particularly preferably, the first phosphor emits yellow light having a dominant wavelength of 560 nm to 575 nm.

In this case, the dominant wavelength should in particular not be equated with a peak wavelength. The dominant wavelength corresponds to the value of the point of intersection of the contour line of the CIE diagram with the connecting line between the color locus of the light emitted by the phosphor and the chromatic locus.

Particularly preferably, the second phosphor is a nitride phosphor. This is taken to mean, in particular, that the second phosphor as a host lattice comprises a nitride material into which a dopant is introduced.

The dopant of the second phosphor is particularly preferably europium $Eu^{2+}$. In this case, the europium content of the second phosphor is preferably 0.5 mol % to 5 mol %.

The second phosphor can correspond, for example, to one of the following chemical formulae: $(Ca_xSr_yBa_{1-x-y})_2Si_5N_8:Eu^{2+}$, where x is greater than or equal to 0 and less than or equal to 0.2 and where y is greater than 0 and less than or equal to 0.5, $(Ca_xSr_{1-x})AlSi(O_yN_{1-2/3y})_3:Eu^{2+}$, where x is greater than 0.1 and less than or equal to 1 and where y is greater than or equal to 0 and less than 0.1. In particular, the second phosphor can be $(Ca,Sr,Ba)_2Si_5N_8:Eu^{2+}$. The europium content here is in each case preferably 0.5 mol % to 5 mol % relative to the substance amount of calcium, strontium and barium in moles.

Particularly preferably, the second phosphor emits red light having a dominant wavelength of 590 nm to 615 nm.

Particularly preferably, the excitation spectrum of the first phosphor and/or of the second phosphor has a relative maximum at a wavelength of greater than or equal to 444 nm in the blue spectral range. Particularly preferably, both excitation spectra, the excitation spectrum of the first phosphor and the excitation spectrum of the second phosphor, have a relative maximum at a wavelength of greater than or equal to 444 nm in the blue spectral range.

Particularly preferably, the excitation spectrum of the first phosphor and/or of the second phosphor has a relative maximum at a wavelength of 444 nm to 460 nm. Particularly preferbly, both excitation spectra, the excitation spectrum of the first phosphor and the excitation spectrum of the second phosphor, have a relative maximum at a wavelength of 444 nm to 460 nm.

The phosphors proposed here have the advantage, in particular, that they exhibit a particularly low quenching behavior under thermal loading. Furthermore, the phosphors proposed here exhibit a particularly high absorption in a comparatively long-wave blue spectral range. This affords the advantage that the phosphors can be better adapted to the temperature dependence of the emission wavelength of a semiconductor body.

Particularly preferably, the phosphor mixture is free of a further wavelength-converting material. In other words, wavelength conversion in the case of the phosphor mixture proposed here takes place particularly preferably only by the first phosphor and the second phosphor. In this case, wavelength conversion is understood to mean that the phosphor absorbs incident electromagnetic radiation in a specific wavelength range, converts this radiation into radiation in a different wavelength range and emits it again. In particular, pure scattering, absorption or reflection without conversion into radiation having a different wavelength are not understood to mean wavelength conversion in the present case.

The first phosphor may have with respect to the second phosphor a ratio of 100:1 to 2:1 relative to weight.

In particular, the proposed phosphor mixture may be used in conjunction with a semiconductor body in an optoelectronic component. The semiconductor body particularly preferably emits electromagnetic radiation in a first wavelength range during operation and the phosphor mixture converts at least part of the radiation emitted by the semiconductor body into radiation of the second and third wavelength ranges, wherein the first, second and third wavelength ranges differ from one another.

The first wavelength range is preferably the emission spectrum of the semiconductor body. The second wavelength range is preferably the emission spectrum of the first phosphor. The third wavelength range is preferably the emission spectrum of the second phosphor.

The first phosphor preferably emits yellow light of the second wavelength range and the second phosphor preferably emits red light of the third wavelength range.

In this case, the semiconductor body is provided to excite the phosphor mixture for wavelength conversion. The semiconductor body therefore particularly preferably emits from a radiation exit surface electromagnetic radiation in the first wavelength range from the blue spectral range. Particularly preferably, the semiconductor body emits radiation adapted to the excitation spectrum of the first phosphor and/or of the second phosphor. Particularly preferably, the emission spectrum of the semiconductor body has at least one relative or one absolute maximum which deviates from a relative or an absolute maximum of the excitation spectrum of the first phosphor by not more than 16 nm. Particularly preferably, the emission spectrum of the semiconductor body has at least one relative or one absolute maximum which deviates from a relative or an absolute maximum of the excitation spectrum of the second phosphor by not more than 16 nm.

The phosphor mixture can be formed from phosphor particles, for example, wherein a multiplicity of first particles comprise the first phosphor or are formed from the first phosphor and a multiplicity of second particles comprise the second phosphor or are formed from the second phosphor.

The particles of the first phosphor preferably have a grain size of 10 μm to 45 μm.

The particles of the second phosphor preferably have a grain size of 3 μm to 45 μm.

Furthermore, it is also possible for the phosphor mixture to be formed from different layers, wherein a first layer comprises the first phosphor or is formed from the first phosphor and a second layer comprises the second phosphor or is formed from the second phosphor.

Particularly if the phosphor mixture comprises phosphor particles, then the latter may be introduced into a resin, preferably a silicone or epoxy. The resin comprising the phosphor particles is arranged, for example, in the form of a wavelength-converting layer on the semiconductor body. Furthermore, it is also possible for the resin comprising the phosphor particles to be arranged in the form of a volume potting above the semiconductor body. In this case, the semiconductor body is preferably arranged in a cutout of a component housing, the potting being filled into the cutout such that the semiconductor body is enveloped by the potting.

Furthermore, the phosphor mixture can be arranged within the optoelectronic component in any other way such that a desired portion of the primary radiation in the first wavelength range emitted by the semiconductor body passes through the phosphor mixture or impinges on the phosphor mixture and is converted by the latter.

Particularly preferably, the optoelectronic component emits mixed-colored light composed of radiation in the first wavelength range and radiation in the two further wavelength ranges and having a color locus in the warm-white range of the CIE standard chromaticity diagram.

The phosphor mixture is, in particular, comparatively temperature-stable. Therefore, it is particularly well suited to use with a street lamp comprising at least one radiation-emitting semiconductor body as illuminant.

The street lamp preferably comprises a semiconductor body which emits electromagnetic radiation in the first wavelength range. Furthermore, the street lamp comprises a phosphor mixture which converts at least part of the radiation in the first wavelength range emitted by the semiconductor body into radiation in the second and third wavelength ranges.

Features in this case described only in conjunction with the phosphor mixture can likewise be used in conjunction with the optoelectronic component and street lamp. Furthermore, features described only in conjunction with the component can also be used for the phosphor mixture or the street lamp. Likewise, features described only in conjunction with the street lamp can be embodied in the case of the phosphor mixture and the component.

Further advantages are evident from the examples described below in conjunction with the figures.

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with an exaggerated size to enable better illustration and/or to afford a better understanding.

The phosphor mixture in accordance with the example in FIG. 1 comprises particles of a first phosphor 1, the emission spectrum of which has a relative intensity maximum in the yellow spectral range. Furthermore, the phosphor mixture comprises particles of a second phosphor 2, the emission spectrum of which has a relative intensity maximum in the red spectral range.

The first phosphor 1 is a garnet phosphor preferably doped with cerium as a dopant. The cerium content is preferably 0.3 mol % to 6 mol %.

By way of example, the first phosphor 1 is selected from the group consisting of $Y_3Al_5O_{12}:Ce^{3+}$, $(Lu,Y)_3Al_5O_{12}:Ce^{3+}$, $Y_3(Al,Ga)_5O_{12}:Ce^{3+}$ and $(Lu,Y)_3(Al,Ga)_5O_{12}:Ce^{3+}$. Furthermore, the first phosphor 1 can also correspond to the general formula $(Lu_xY_{1-x})_3(Al_{1-y}Ga_y)_5O_{12}:Ce^{3+}$, where x is greater than or equal to 0 and less than or equal to 1 and where y is greater than or equal to 0 and less than or equal to 0.4. The cerium content here is in each case preferably 0.3 mol % to 6 mol % relative to the substance amount of lutetium and yttrium in moles.

Particularly preferably, the first phosphor 1 emits yellow light having a dominant wavelength of 560 nm to 575 nm.

In the example in FIG. 1, the second phosphor 2 is a europium-doped nitride phosphor. By way of example, the second phosphor 2 can be $(Ca,Sr,Ba)_2Si_5N_8:Eu^{2+}$. Furthermore, the second phosphor 2 can also conform to one of the following chemical formulae: $(Ca_xSr_yBa_{1-x-y})_2Si_5N_8:Eu^{2+}$, where x is greater than or equal to 0 and less than or equal to 0.2 and where y is greater than or equal to 0 and less than or equal to 0.5, $(Ca_xSr_{1-x})AlSi(O_yN_{1-2/3y})_3:Eu^{2+}$, where x is greater than 0.1 and less than or equal to 1 and where y is greater than or equal to 0 and less than 0.1. The europium content here is in each case preferably 0.5 mol % to 5 mol % relative to the substance amount of calcium, strontium and barium in moles.

Preferably, the second phosphor 2 emits red light having a dominant wavelength of 590 nm to 615 nm.

In the example in FIG. 1, the excitation spectrum of the first phosphor 1 and/or of the second phosphor 2 has a relative maximum at a wavelength of greater than or equal to 444 nm in the blue spectral range. Particularly preferably, the excitation spectrum of the first phosphor 1 and/or of the second phosphor 2 has a relative maximum at a wavelength of 444 nm to 460 nm.

The optoelectronic component in accordance with the example in FIG. 2 comprises a semiconductor body 3. The semiconductor body 3 has an active zone 4 that generates electromagnetic radiation. The semiconductor body 3 emits radiation of a first wavelength range from its radiation exit surface 5, wherein the first wavelength range comprises blue radiation.

In the case of the optoelectronic components in accordance with the example in FIG. 2, a wavelength-converting layer 6 is applied to the radiation exit surface 5 of the semiconductor body 3. The wavelength-converting layer comprises a resin 7 into which is introduced a phosphor mixture such as has already been described, for example, with reference to FIG. 1.

The particles of the first phosphor 1 convert the blue light of the first wavelength range emitted from the radiation exit surface 5 of the semiconductor body 3 into yellow light of a second wavelength range. Furthermore, the particles of the second phosphor 2 convert blue radiation of the first wavelength range generated by the active zone 4 into red light of a third wavelength range. In this case, the wavelength-converting layer 6 is designed such that mixed-colored radiation having a color locus in the warm-white range of the CIE standard chromaticity diagram arises.

Furthermore, a bonding pad 8 is applied laterally with respect to the wavelength-converting layer 6, the bonding pad being provided to electrically contact with the semiconductor body 3.

FIG. 3 shows by way of example measured values of the luminous flux F of an optoelectronic component in lumens per watt as a function of time t in seconds. The dashed line represents measured values of an optoelectronic component comprising my phosphor mixture, while the solid line represent measured values of an optoelectronic component comprising a conventional phosphor mixture. By comparison with an optoelectronic component comprising a conventional phosphor mixture, an optoelectronic component comprising my phosphor mixture advantageously has a uniformly higher efficiency with increasing operating duration t.

Figure 4:
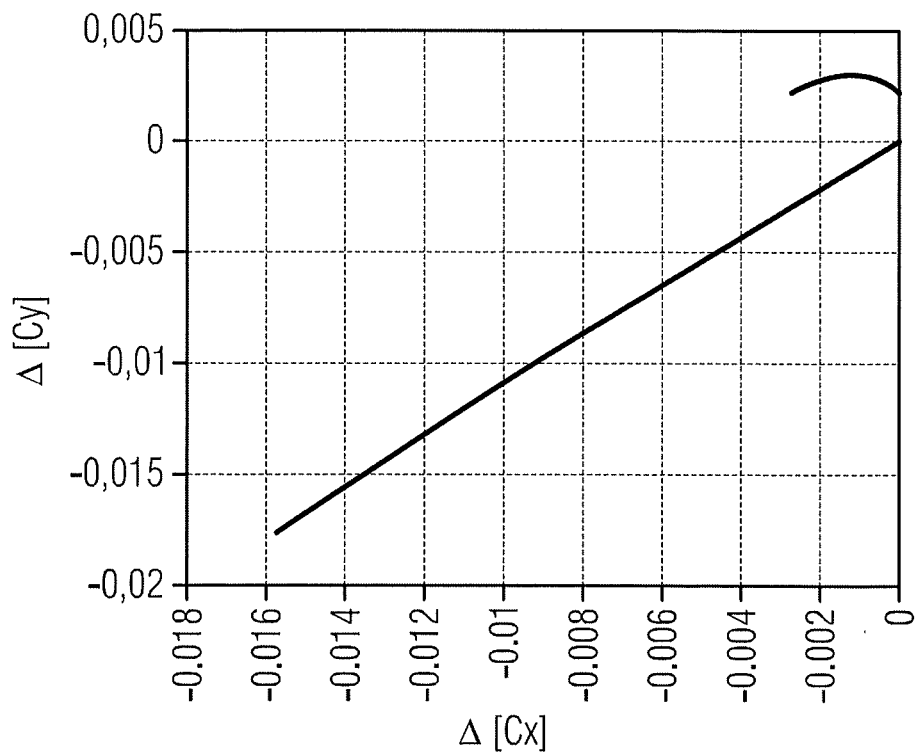
FIG. 4 shows measured values of the color locus coordinates Cx and Cy of the light emitted by an optoelectronic component with increasing operating duration.

FIG. 4 shows by way of example measured values of the color locus coordinates Cx and Cy of the light emitted by an optoelectronic component with increasing operation duration t. In this case, the dashed line represents color coordinates of the light from an optoelectronic component comprising my phosphor mixture, while the solid line represent the measured color coordinates of an optoelectronic component comprising a conventional phosphor mixture. By comparison with an optoelectronic component comprising a conventional phosphor mixture, an optoelectronic component comprising my phosphor mixture advantageously has a higher stability of the color locus of the emitted light with increasing operating duration t.

Figure 5:
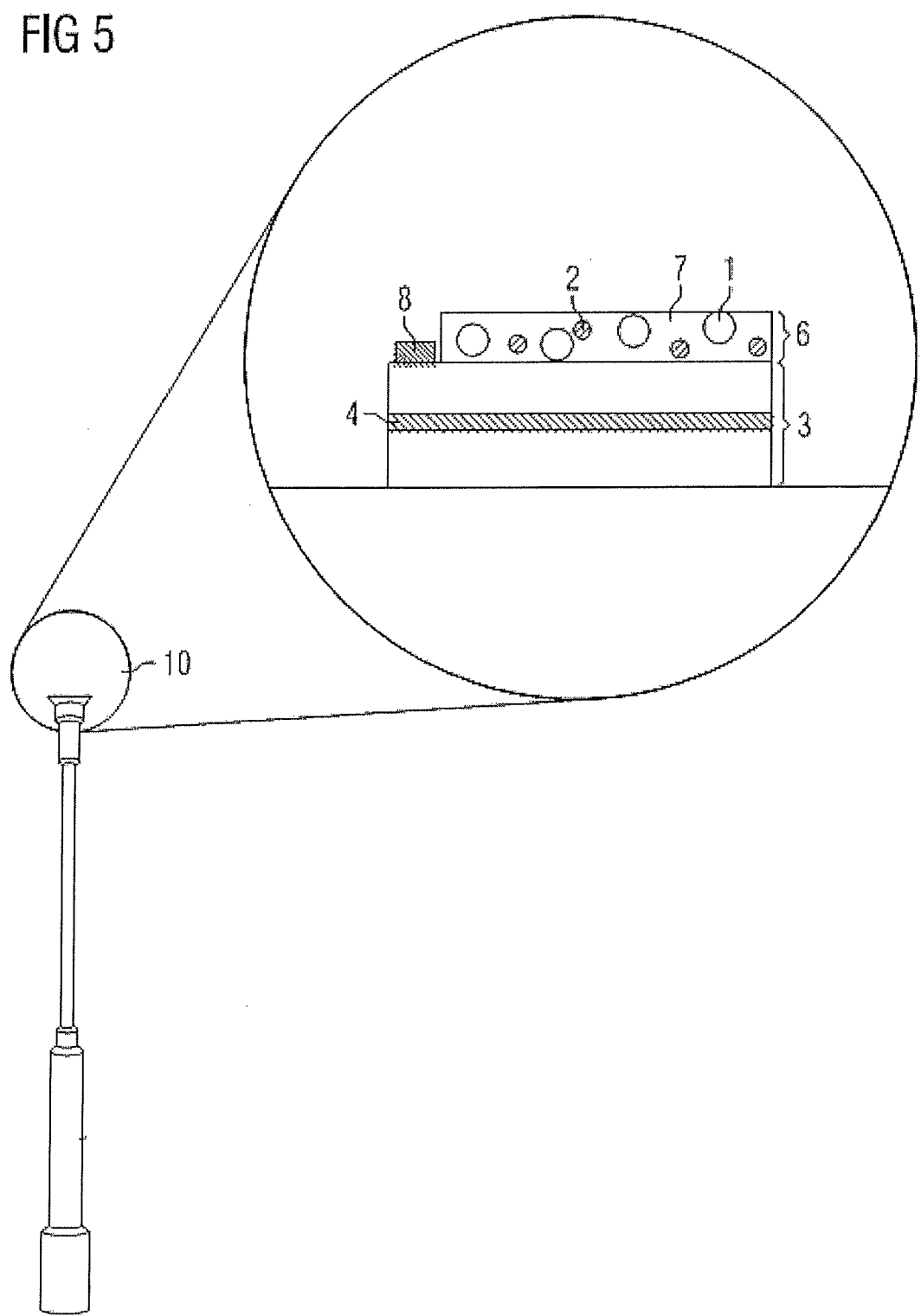
FIG. 5 shows a schematic illustration of a street lamp in accordance with an example.

The street lamp in accordance with the example in FIG. 5 comprises a lamp base and a lamp screen 10 surrounding the illuminant. An optoelectronic component such as has been described, for example, with reference to FIG. 2 is used as the illuminant.

My phosphor mixtures, components and street lamps are not restricted to the examples by the description on the basis of the examples. Rather, this disclosure encompasses any novel feature and also any combination of features which in particular includes any combination of features in the appended claims, even if the feature or combination itself is not explicitly specified in the claims or examples.

The invention claimed is:

1. A phosphor mixture comprising a first phosphor and a second phosphor, wherein
   an emission spectrum of the first phosphor has a relative intensity maximum in a yellow spectral range and an emission spectrum of the second phosphor has a relative intensity maximum in a red spectral range and emits red light having a dominant wavelength of 590 nm to 615 nm,
   the first phosphor corresponds to the following chemical formula: $(Lu_xY_{1-x})_3(Al_{1-y}Ga_y)_5O_{12}:Ce^{3+}$, where x is greater than or equal to 0 and less than or equal to 1 and where y is greater than or equal to 0 and less than or equal to 0.4,
   the second phosphor is selected from the group consisting of $(Ca,Sr,Ba)_2Si_5N_8Eu^{2+}$ and $(Ca_xSr_yBa_{1-x-y})_2Si_5N_8:Eu^{2+}$, where x is greater than or equal to 0 and less than or equal to 0.2 and y is greater than 0 and less than or equal to 0.5, $(Ca_xSr_{1-x})AlSi(O_yN_{1-2/3y})_3:Eu^{2+}$, where x is greater than 0.1 and less than or equal to 1 and y is greater than or equal to 0 and less than 0.1, and
   the phosphor mixture is formed from a plurality of particles, which comprises a plurality of particles of the first phosphor and a plurality of particles of the second phosphor.

2. The phosphor mixture according to claim 1, wherein the first phosphor is a garnet phosphor.

3. The phosphor mixture according to claim 1, wherein the first phosphor is a cerium-doped garnet phosphor and cerium content is 0.3 mol % to 6 mol %.

4. The phosphor mixture according to claim 1, wherein the first phosphor is selected from the group consisting of $Y_3Al_5O_{12}:Ce^{3+}$, $(Lu,Y)_3Al_5O_{12}:Ce^{3+}$, $Y_3(Al,Ga)_5O_{12}:Ce^{3+}$ and $(Lu,Y)_3(Al,Ga)_5O_{12}:Ce^{3+}$.

5. The phosphor mixture according to claim 4, wherein cerium content is 0.3 mol % to 6 mol % relative to a substance amount of lutetium and yttrium in moles.

6. The phosphor mixture according to claim 1, wherein the first phosphor emits yellow light having a dominant wavelength of 560 nm to 575 nm.

7. The phosphor mixture according to claim 1, wherein the second phosphor is a nitride phosphor.

8. The phosphor mixture according to claim 1, wherein the second phosphor is a europium-doped nitride phosphor and europium content is 0.5 mol % to 5 mol %.

9. The phosphor mixture according to claim 1, wherein the second phosphor is selected from the group consisting of $(Ca,Sr,Ba)_2Si_5N_8:Eu^{2+}$ and $(Ca_xSr_yBa_{1-x-y})_2Si_5N_8:Eu^{2+}$, where x is greater than or equal to 0 and less than or equal to 0.2 and where y is greater than 0 and less than or equal to 0.5.

10. The phosphor mixture according to claim 9, wherein europium content is 0.5 mol % to 5 mol % relative to a substance amount of calcium, strontium and barium in moles.

11. The phosphor mixture according to claim 1, wherein an excitation spectrum of the first phosphor and/or of the second phosphor has a relative maximum at a wavelength of greater than or equal to 444 nm in a blue spectral range.

12. The phosphor mixture according to claim 1, wherein the excitation spectrum of the first phosphor and/or of the second phosphor has a relative maximum at a wavelength of 444 nm to 460 nm.

13. The phosphor mixture according to claim 1, which is free of a further wavelength-converting material.

14. An optoelectronic component comprising a semiconductor body-which emits electromagnetic radiation of a first wavelength range during operation, and a phosphor mixture according to claim 1, which converts at least part of radiation of a first wavelength range emitted by the semiconductor body into radiation of a second wavelength range different from the first wavelength range, and into radiation of a third wavelength range different from the first and second wavelength ranges.

15. The optoelectronic component according to claim 14, which emits mixed-colored light composed of radiation of the first wavelength range and radiation of the second and third wavelength ranges and having a color locus in a warm-white range of the CIE standard chromaticity diagram.

16. A street lamp comprising a semiconductor body that emits electromagnetic radiation of a first wavelength range during operation, and a phosphor mixture according to claim 1, which converts at least part of radiation of a first wavelength range emitted by the semiconductor body into radiation of a second wavelength range different from the first wavelength range, and into radiation of a third wavelength range different from the first and second wavelength ranges.

* * * * *